United States Patent
Takahashi et al.

(10) Patent No.: US 7,253,246 B2
(45) Date of Patent: Aug. 7, 2007

(54) THERMOSETTING POLYCARBODIIMIDE COPOLYMER

(75) Inventors: Ikuo Takahashi, Tokyo (JP); Hideshi Tomita, Tokyo (JP)

(73) Assignee: Nisshinbo Industries, Inc., Tokyo (JP)

( * ) Notice: Subject to any disclaimer, the term of this patent is extended or adjusted under 35 U.S.C. 154(b) by 82 days.

(21) Appl. No.: 11/133,343

(22) Filed: May 20, 2005

(65) Prior Publication Data

US 2005/0261448 A1 Nov. 24, 2005

(30) Foreign Application Priority Data

May 21, 2004 (JP) ............................. 2004-152354

(51) Int. Cl.
*C08G 64/00* (2006.01)
(52) U.S. Cl. ................... 528/196; 264/176.1; 264/219; 428/411.1
(58) Field of Classification Search ............. 264/176.1, 264/219; 428/411.1; 528/196, 198
See application file for complete search history.

(56) References Cited

U.S. PATENT DOCUMENTS

2002/0055606 A1   5/2002   Misumi et al.

FOREIGN PATENT DOCUMENTS

| DE | 1 130 594 | 5/1962 |
|---|---|---|
| GB | 851936 | 10/1960 |
| JP | 407292229 | * 11/1995 |

OTHER PUBLICATIONS

European Search Report, for Application No. 05 01 0836.4-2115 PCT/, dated Sep. 2, 2005.

* cited by examiner

*Primary Examiner*—Terressa Boykin
(74) *Attorney, Agent, or Firm*—Antonelli, Terry, Stout & Kraus, LLP.

(57) ABSTRACT

A thermosetting polycarbodiimide copolymer of the present invention comprises in a molecule thereof, a soft segment containing at least one residue formed by removing opposite functional end groups of polytetramethylene ether glycol, polyether block amide and polyalkylene carbonate diol having at least two mixed alkylene chains selected from the group consisting of hexamethylene, pentamethylene and tetramethylene; and a hard segment made of polycarbodiimide bonded to the soft segment through at least one bond selected from the group consisting of an urethane bond, a urea bond and an amide bond. The thermosetting polycarbodiimide copolymer can exhibit not only a high heat resistance and a good flexibility, but also an excellent flexing resistance (resistance to 180° bending),and can be, therefore, suitably used in applications of various electronic parts, for example, as materials of base films or cover-lay films for flexible wiring boards, or adhesive films.

18 Claims, No Drawings

THERMOSETTING POLYCARBODIIMIDE COPOLYMER

BACKGROUND OF INVENTION

1. Field of the Invention

The present invention relates to thermosetting polycarbodiimide copolymers, a process for producing the polycarbodiimide copolymers, thermosetting resin compositions containing the polycarbodiimide copolymers, and heat-resistant flexible films, and more particularly to thermosetting polycarbodiimide copolymers that are suitably used in applications of various electronic parts, for example, as materials of base films or cover-lay films for flexible wiring boards, or adhesive films, and can exhibit not only a high heat resistance and a good flexibility, but also an excellent flexing resistance (resistance to 180° bending); thermosetting resin compositions containing the polycarbodiimide copolymers; a process for efficiently producing the polycarbodiimide copolymers; and heat-resistant flexible films produced from the polycarbodiimide copolymers or the thermosetting resin compositions.

2. Description of the Prior Art

In general, as resins having a high heat resistance, there are known thermosetting aromatic polycarbodiimides produced from raw monomers such as diphenylmethane diisocyanate and tolylene diisocyanate. Such aromatic polycarbodiimides have been used as flame-resistant films or heat-resistant adhesives because of an excellent heat resistance thereof.

The aromatic polycarbodiimide films have such an advantage that they are free from production of volatilized gases or decomposed monomer products even when exposed to a temperature of 400° C. or higher. However, the aromatic polycarbodiimides tend to suffer from self-crosslinking when heat-treated at a temperature as high as about 200° C. for a long period of time, so that films produced therefrom tend to be deteriorated in flexibility. In addition, the aromatic polycarbodiimide films themselves have a high elastic modulus and are, therefore, unusable in applications requiring bending, for example, in applications of various electronic parts such as base films or cover-lay films for flexible wiring boards, or adhesive films.

As the thermosetting resin compositions having a good flexibility and molded articles produced therefrom, there are disclosed, for example, (1) thermosetting resin compositions containing a diene elastomer-modified epoxy compound, a polycarbonate-based resin and a curing agent as effective ingredients (e.g., refer to Japanese Patent Application Laid-Open No. Heisei 5(1993)-70667), (2) thermosetting resin compositions containing (A) at least one thermosetting resins selected from the group consisting of epoxy resins, cyanate resins and bismaleimide resins, (B) a specific thermoplastic resin, and (C) a specific rubber (e.g., refer to Japanese Patent Application Laid-Open No. Heisei 7(1995)-149952), (3) thermosetting adhesive sheets containing an imide resin prepolymer, an epoxy resin and an elastomer (e.g., refer to Japanese Patent Application Laid-Open No. Heisei 6(1994)-329998), or the like.

However, the thermosetting resin compositions (1) and (2) tend to be insufficient in heat resistance owing to adverse influence of the low-heat-resistant thermoplastic resin or elastomer (rubber) contained therein, thereby failing to meet a high heat-resisting level required for lead-free soldering. Also, the thermosetting adhesive sheets (3) have an excellent heat resistance, but are difficult to handle by ordinary apparatuses since they must be heat-treated upon curing thereof at a temperature as high as 200° C. Therefore, the thermosetting adhesive sheets can be used only in limited applications. In addition, any of the above compositions and sheets contains an epoxy resin-cured component and, therefore, fails to show a good flexibility capable of withstanding 180° bending.

On the other hand, as compositions containing polycarbodiimide or a carbodiimide compound, there are disclosed, for example, (4) elastomer compositions containing a polyester, vulcanized rubber fine particles and polycarbodiimide (e.g., refer to Japanese Patent Application Laid-Open No. Heisei 5(1993)-295243), (5) fiber-reinforced polyurethane resin compositions containing a thermoplastic polyurethane resin, reinforcing fibers and a carbodiimide compound (e.g., refer to Japanese Patent Application Laid-Open No. 2003-201349), or the like.

All of these conventional compositions are thermoplastic resin compositions which are enhanced in high-temperature characteristics by blending a small amount of polycarbodiimide or the carbodiimide compound therein and, therefore, tend to be still unsatisfactory to meet a high heat-resisting level requiring for lead-free soldering.

In addition, there are disclosed polycarbodiimide copolymers containing a polyfunctional liquid rubber component in a molecule thereof (e.g., refer to Japanese Patent Application Laid-Open No. Heisei 11(1999)-322888). The polycarbodiimide copolymers have been developed for the purposes of improving a thermoforming property as well as controlling a swelling property under heating. Thus, the conventional materials still fail to satisfy not only a high heat resistance and a good flexibility, but also a flexing resistance (resistance to 180° bending).

Further, there are disclosed carbodiimide copolymers containing hexamethylene carbonate diol in a molecule thereof (e.g., refer to Japanese Patent Application Laid-Open No. 2002-279830). The carbodiimide copolymers are resins capable of being softened upon heating, but fail to show a good elasticity, i.e., a sufficient flexing resistance owing to crystallinity of the hexamethylene carbonate component contained therein.

SUMMARY OF THE INVENTION

An object of the present invention is to provide thermosetting polycarbodiimide copolymers that are suitably used in various applications of electronic parts, for example, as materials of base films or cover-lay films for flexible wiring boards, or adhesive films, and can exhibit not only a high heat resistance and a good flexibility, but also an excellent flexing resistance (resistance to 180° bending), a process for producing the polycarbodiimide copolymers, and use of the polycarbodiimide copolymers.

As a result of extensive researches in view of the above object, the inventors have found that thermosetting polycarbodiimide copolymers containing in a molecule a specific soft segment and a specific hard segment which are bonded to each other through a specific bonding group can exhibit not only a high heat resistance and a good flexibility, but also an excellent flexing resistance (resistance to 180° bending).

Also, it has been found that the above thermosetting polycarbodiimide copolymers can be efficiently produced by reacting a polymer exhibiting a liquid state or a flexible solid state at an ordinary temperature which constitutes the above specific soft segment and contains functional groups on opposite ends thereof, with an excess amount of an aromatic diisocyanate compound to obtain a both end isocyanate-terminated compound, and then subjecting the both end isocyanate-terminated compound to a carbodiimidation reaction.

Further, it has been found that films obtained by forming the above thermosetting polycarbodiimide copolymers or thermosetting resin compositions containing the copolymers into a film and subjecting the obtained film to a heat curing treatment, are excellent in both heat resistance and flexibility and, therefore, can be suitably used in the above applications, for example, for electronic parts.

The present invention has been accomplished on the basis of the above findings.

Thus, the present invention provides the following aspects (1) to (5):

(1) A thermosetting polycarbodiimide copolymer comprising in a molecule thereof, a soft segment containing at least one residue formed by removing opposite functional end groups of polytetramethylene ether glycol, polyether block amide and polyalkylene carbonate diol having at least two alkylene chains selected from the group consisting of hexamethylene, pentamethylene and tetramethylene; and a hard segment made of polycarbodiimide bonded to the soft segment through at least one bond selected from the group consisting of an urethane bond, a urea bond and an amide bond.

(2) The thermosetting polycarbodiimide copolymer according to the aspect (1), wherein said copolymer contains constituting units each represented by the general formula (I):

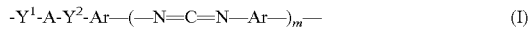

$$-Y^1-A-Y^2-Ar-(-N=C=N-Ar-)_m-$$ (I)

wherein Ar represents an arylene group; A represents a soft segment containing at least one residue formed by removing opposite functional end groups of polytetramethylene ether glycol, polyether block amide and polyalkylene carbonate diol having at least two alkylene chains selected from the group consisting of hexamethylene, pentamethylene and tetramethylene; $Y^1$ and $Y^2$ respectively represent at least one bond having a nitrogen atom bonded to Ar which is selected from the group consisting of an urethane bond, a urea bond and an amide bond; and m is an integer of 1 or more.

(3) A process for producing a thermosetting polycarbodiimide copolymer containing constituting units each represented by the general formula (I):

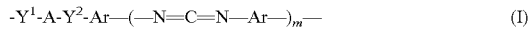

$$-Y^1-A-Y^2-Ar-(-N=C=N-Ar-)_m-$$ (I)

wherein Ar, A, $Y^1$, $Y^2$, and m are the same as defined above, said process comprising:

reacting a polymer exhibiting a liquid state or a flexible solid state at an ordinary temperature which is represented by the general formula (II):

$$X^1-A-X^2$$ (II)

wherein $X^1$ and $X^2$ respectively represent a functional group selected from the group consisting of a hydroxyl group, an amino group and a carboxyl group; and A is at least one residue formed by removing opposite functional end groups of polytetramethylene ether glycol, polyether block amide and polyalkylene carbonate diol having at least two alkylene chains selected from the group consisting of hexamethylene, pentamethylene and tetramethylene; $Y^1$ and $Y^2$ respectively represent at least one bond having a nitrogen atom bonded to Ar which is selected from the group consisting of an urethane bond, a urea bond and an amide bond; and m is an integer of 1 or more. with an aromatic diisocyanate compound represented by the general formula (III):

$$OCN-Ar-NCO$$ (III)

wherein Ar is the same as defined above, to obtain a both end isocyanate-terminated compound having isocyanate groups on opposite ends thereof which is represented by the general formula (IV):

$$OCN-Ar-(Y^1-A-Y^2-Ar)_p-NCO$$ (IV)

wherein $Y^1$, $Y^2$, Ar and A are the same as defined above; and p is an integer of 1 or more; and subjecting the obtained both end isocyanate-terminated compound to a carbodiimidation reaction in the presence of a carbodiimidation catalyst.

(4) A thermosetting resin composition comprising the thermosetting polycarbodiimide copolymer as described in any of the aspect (1) or (2).

(5) A heat-resistant flexible film produced by forming the thermosetting polycarbodiimide copolymer as described in the aspect (1) or (2) or the thermosetting resin composition as described in the aspect (4) into a film, and subjecting the film to a heat curing treatment.

EFFECT OF THE INVENTION

According to the present invention, there are provided thermosetting polycarbodiimide copolymers that are suitably used in applications of various electronic parts, for example, as materials of base films or cover-lay films for flexible wiring boards, or adhesive films, and can exhibit not only a high heat resistance and a good flexibility, but also an excellent flexing resistance (resistance to 180° bending), as well as thermosetting resin compositions containing thermosetting polycarbodiimide copolymers.

In addition, according to the present invention, there are provided a process for efficiently producing the thermosetting polycarbodiimide copolymers, and heat-resistant flexible films that are obtained by forming the above thermosetting polycarbodiimide copolymers or the above thermosetting resin compositions into a film and subjecting the obtained film to a heat curing treatment, and can be suitably used in the above applications.

DETAILED DESCRIPTION OF THE INVENTION

First, the thermosetting polycarbodiimide copolymer of the present invention is described.

The thermosetting polycarbodiimide copolymer of the present invention is such a thermosetting resin comprising in a molecule thereof, a soft segment containing at least one residue formed by removing opposite functional end groups of polytetramethylene ether glycol, polyether block amide and polyalkylene carbonate diol having at least two mixed alkylene chains selected from the group consisting of hexamethylene, pentamethylene and tetramethylene; and a hard segment made of polycarbodiimide bonded to the soft segment through at least one bond selected from the group consisting of an urethane bond, a urea bond and an amide bond.

The functional groups bonded to opposite ends of the above polytetramethylene ether glycol and polyalkylene carbonate diol are hydroxyl groups (urethane bond), whereas the functional groups bonded to opposite ends of the above polyether block amide are mainly carboxyl groups (amide bond), but may also be amino groups (urea bond). Further, one functional end group of the polyether block amide may be a carboxyl group (amide bond), and the other functional end group thereof may be amino group (urea bond). Meanwhile, the bond indicated in the parentheses is the kind of bond formed by the respective functional groups.

The mass ratio of the soft segment to the hard segment in the thermosetting polycarbodiimide copolymer of the present invention is usually selected from the range of from 20:100 to 500:100. When the mass ratio lies in the above-specified range, the polycarbodiimide copolymer can provide a thermosetting resin exhibiting not only a good flexibility but also an excellent heat resistance. The mass ratio of the soft segment to the hard segment is preferably in the range of from 50 to 300:100 and more preferably from 70 to 200:100.

The thermosetting polycarbodiimide copolymer of the present invention is such polycarbodiimide copolymers containing constituting units each represented by the general formula (I):

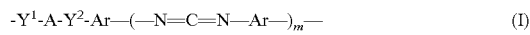

$-Y^1-A-Y^2-Ar-(-N=C=N-Ar-)_m-$ (I)

wherein Ar represents an arylene group; A represents a soft segment containing at least one residue formed by removing opposite functional end groups of polytetramethylene ether glycol, polyether block amide and polyalkylene carbonate diol having at least two mixed alkylene chains selected from the group consisting of hexamethylene, pentamethylene and tetramethylene; $Y^1$ and $Y^2$ respectively represent at least one bond having a nitrogen atom bonded to Ar which is selected from the group consisting of an urethane bond, a urea bond and an amide bond; and m is an integer of 1 or more.

In the above general formula (I), examples of the arylene group represented by Ar include a phenylene group, a naphthylene group, a diphenylmethane-di-yl group, a diphenylether-di-yl group, and groups having at least one substituent group such as a lower-alkyl group and a lower-alkoxy group on an aromatic ring of these groups. In the general formula (I), a single Ar group or a plurality of Ar groups may be present. The symbol m is an integer of 1 to more and preferably 5 to 50.

In the present invention, as the polymer having functional groups on opposite ends thereof which constitutes the soft segment A, there may be used polytetramethylene ether glycol, polyether block amide and polyalkylene carbonate diol having at least two mixed alkylene chains selected from the group consisting of hexamethylene, pentamethylene and tetramethylene. These polymers may be used singly or in combination of any two or more thereof.

The above polytetramethylene ether glycol is usually a polyether glycol represented by the general formula (V):

$HO-(CH_2CH_2CH_2CH_2O)_n-H$ (V)

wherein n represents a polymerization degree. The number-average molecular weight of the polytetramethylene ether glycol is usually in the range of from about 600 to about 3000.

The above polyether block amide is a block copolymer of polyamide and polyalkylene ether. As the polyamide component of the polyether block amide, there may be usually used aliphatic polyamides such as nylon 6, nylon 11 and nylon 12. Examples of the polyalkylene ether include polyethylene ether, polypropylene ether and polytetramethylene ether. The functional groups bonded to opposite ends of the polyether block amide are usually carboxyl groups. However, both of the functional end groups may be amino groups, or one functional end group may be a carboxyl group and the other functional end group may be an amino group.

The polyether block amide has a number-average molecular weight of usually about 1000 to 5000 and preferably 1000 to 3000.

Also, in the present invention, as the polyalkylene carbonate diol, there may be used those containing at least two mixed alkylene chains selected from the group consisting of hexamethylene, pentamethylene and tetramethylene.

If polyhexamethylene carbonate diol, polypentamethylene carbonate diol or polytetramethylene carbonate diol is used singly as the soft segment, since the respective polyalkylene carbonate diols have a crystallinity, the resultant polycarbodiimide copolymers fail to exhibit a sufficient elasticity.

On the contrary, when the-polyalkylene carbonate diol containing at least two alkylene chains selected from the group consisting of hexamethylene, pentamethylene and tetramethylene is used as the soft segment, since the polyalkylene carbonate diol has a low crystallinity, the resultant polycarbodiimide copolymers can exhibit a sufficient elasticity. Examples of the preferred mixed alkylene chains include the combination of pentamethylene and hexamethylene, and the combination of tetramethylene and hexamethylene. These alkylene chains may be used in combination with each other in an appropriate amount according to the applications aimed by the present invention. The mass ratio of pentamethylene (tetramethylene) to hexamethylene is, for example, 5:95 to 95:5, more preferably 10:90 to 90:10.

The polyalkylene carbonate diol used in the present invention may be produced by known methods, for example, by the method described in paragraphs of from [0008] to [0011] of Japanese Patent Application Laid-Open 2003-183376, more specifically by transesterifying at least two diols appropriately selected from 1,6-hexane diol, 1,5-pentane diol and 1,4-butane diol according to the above desired combination, with dialkyl carbonate such as dimethyl carbonate. The polyalkylene carbonate glycol has a number-average molecular weight of usually about 500 to 5000 and preferably 600 to 3000.

In the present invention, as the polymer having functional groups on opposite ends thereof which constitutes the soft segment A, the above-described polymer may be used, if desired, in combination with a polyorganosiloxane represented by the general formula (VI):

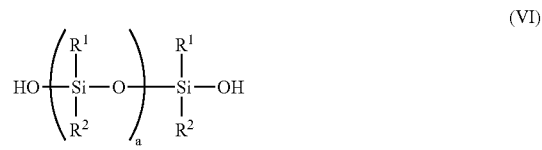

(VI)

wherein $R^1$ and $R^2$ independently represent an alkyl group having 1 to 10 carbon atoms or an aryl group having 6 to 10 carbon atoms; and a is an integer of 1 to 20, or the other soft segment-forming polymers.

In the above general formula (VI), the alkyl group having 1 to 10 carbon atoms as $R^1$ and $R^2$ may be either linear, branched or cyclic. Specific examples of the alkyl group having 1 to 10 carbon atoms include methyl, ethyl, n-propyl, isopropyl, various butyl groups, various pentyl groups, various hexyl groups, various octyl groups, various decyl groups, cyclopentyl and cyclohexyl. Specific examples of the aryl group having 6 to 10 carbon atoms include phenyl, tolyl, xylyl and naphthyl. $R^1$ and $R^2$ are preferably methyl and phenyl, respectively, and $R^1$ and $R^2$ may be the same or different from each other.

As the polyorganosiloxane represented by the general formula (VI), there are preferably used those having hydroxyl groups on opposite ends thereof, such as polydimethylsiloxane, polydiphenylsiloxane and polymethylphenylsiloxane.

In the present invention, as the polymer exhibiting a liquid state or a flexible solid state at an ordinary temperature and having functional groups on opposite ends thereof which constitutes the soft segment of the above polycarbodiimide copolymer, there may be used polytetramethylene ether glycol (PTMG), polyether block amide (PEBA), or poly-mixed alkylene carbonate diol (PCDL) having at least two mixed alkylene chains selected from the group consisting of hexamethylene, pentamethylene and tetramethylene. These polymers may be used singly or in combination of any two or more thereof.

In the thermosetting polycarbodiimide copolymer containing the constituting units each represented by the general formula (I), for the above-described reasons, the mass ratio of the whole components A to the whole components corresponding to [Ar—(N=C=N—Ar)$_m$] contained in the molecule thereof is in the range of preferably 0.2 to 5, more preferably 0.5 to 3 and still more preferably 0.7 to 2. Meanwhile, the "whole components corresponding to [Ar—(N=C=N—Ar)$_m$]" means a sum of the whole components [Ar—(N=C=N—Ar)$_m$] in the constituting units each represented by the above general formula (I) and the components of [Ar—(N=C=N—Ar)$_n$] wherein n is an integer of 1 or more which are present in moieties of the molecule other than the constituting units. Also, in the polycarbodiimide copolymer, the number of the constituting units each represented by the general formula (I) is preferably in the range of about 1 to 5. When the number of the constituting units lies in the above-specified range, the polycarbodiimide copolymer can be prevented from suffering from gelation owing to increase in its molecular weight, upon production thereof.

In the thermosetting polycarbodiimide copolymer containing the constituting units each represented by the above general formula (I), the constituting units may be present in the form of repeating units or in the form of those constituting units contained in a random copolymer.

The thermosetting polycarbodiimide copolymer contains the soft segment and, therefore, exhibits an excellent flexibility. Further, the thermosetting polycarbodiimide copolymer is excellent in heat resistance, so that a heat-cured product of the copolymer can exhibit a glass transition point of usually 130° C. or higher and preferably 200° C. or higher.

Next, the process for producing the thermosetting polycarbodiimide copolymer according to the present invention is described.

The thermosetting polycarbodiimide copolymer containing the constituting units each represented by the above general formula (I) can be efficiently produced by the following process according to the present invention.

In the process of the present invention, the thermosetting polycarbodiimide copolymer containing the constituting units each represented by the above general formula (I) can be produced by reacting a polymer exhibiting a liquid state or a flexible solid state at an ordinary temperature which is represented by the general formula (II):

$$X^1\text{-}A\text{-}X^2 \qquad (II)$$

wherein $X^1$ and $X^2$ respectively represent a functional group selected from the group consisting of a hydroxyl group, an amino group and a carboxyl group; and A is the same as defined above, with an aromatic diisocyanate compound represented by the general formula (III):

$$\text{OCN—Ar—NCO} \qquad (III)$$

wherein Ar is the same as defined above, to obtain a both end isocyanate-terminated compound having isocyanate groups on opposite ends thereof which is represented by the general formula (IV):

$$\text{OCN—Ar—}(Y^1\text{-A-}Y^2\text{-Ar})_p\text{—NCO} \qquad (IV)$$

wherein Ar, $Y^1$, $Y^2$, A and p are the same as defined above; and subjecting the obtained both end isocyanate-terminated compound to a carbodiimidation reaction in the presence of a carbodiimidation catalyst. The thermosetting polycarbodiimide copolymer produced by the above process is also involved in the scope of the present invention.

As the polymer exhibiting a liquid state or a flexible solid state at an ordinary temperature which is represented by the above general formula (II), there may be used at least one compound selected from the group consisting of the polytetramethylene ether glycol represented by the above general formula (V), polyether block amide and poly-mixed alkylene carbonate diol. In the present invention, the polytetramethylene ether glycol (PTMG), polyether block amide (PEBA) and poly-mixed alkylene carbonate diol (PCDG) may be used singly or in the form of a mixture thereof.

Examples of the aromatic diisocyanate compound represented by the above general formula (III) include 4,4'-diphenylmethane diisocyanate, 4,4'-diphenyl ether diisocyanate, p-phenylene diisocyanate, m-phenylene diisocyanate, 3,3'-dimethoxy-4,4'-biphenyl diisocyanate, o-tolidine diisocyanate, naphthylene diisocyanate, 2,4-tolylene diisocyanate, 2,6-tolylene diisocyanate, 3,3'-dimethoxy-4,4'-diphenylmethane diisocyanate and 3,3'-dimethyl-4,4'-diphenylether diisocyanate. These aromatic diisocyanate compounds may be used singly or in combination of any two or more thereof.

In the process of the present invention, the polymer containing functional groups on opposite ends thereof and exhibiting a liquid state or a flexible solid state at an ordinary temperature which is represented by the above general formula (II) is reacted with the aromatic diisocyanate compound represented by the above general formula (III) usually by using the aromatic diisocyanate compound in a molar amount two times or more that of the polymer, thereby producing the both end isocyanate-terminated compound represented by the above general formula (IV). This reaction may be conducted, if required, in the presence of an appropriate solvent. Examples of the solvent include alicyclic ethers such as tetrahydrofuran and dioxane, aromatic hydrocarbon compounds such as benzene and toluene, and alicyclic ketones such as cyclopentanone and cyclohexanone. These solvents may be used singly or in combination of any two or more thereof.

The reaction temperature is usually in the range of 50 to 200° C. through it varies depending upon kinds of functional groups bonded to opposite ends of the polymer or the solvent used.

Next, the thus obtained both end isocyanate-terminated compound is further reacted with the aromatic diisocyanate compound which is present in an excess amount in the reaction system and, if required, a freshly added aromatic diisocyanate compound in the presence of a carbodiimidation catalyst, thereby producing the polycarbodiimide copolymer.

As the carbodiimidation catalyst, there may be used conventionally known catalysts. Specific examples of the carbodiimidation catalyst include phospholene oxides such as 3-methyl-1-phenyl-2-phospholene-1-oxide, 3-methyl-1-phenyl-3-phospholene-1-oxide and 3-methyl-1-ethyl-2-phospholene-1-oxide. Of these carbodiimidation catalysts, 3-methyl-1-phenyl-2-phospholene-1-oxide is preferred from the standpoint of good reactivity. The amount of the carbodiimidation catalyst used is usually in the range of from 0.1 to 1.0% by mass based on the amount of the aromatic diisocyanate compound used for the carbodiimidation.

The carbodiimidation reaction temperature is in the range of about 30 to 150° C. and preferably 50 to 130° C. though it varies depending upon kind of solvent used and concentration of the raw monomer.

The amount of the aromatic diisocyanate compound used in the carbodiimidation reaction is usually 2 mol or more per 1 mol of the above polymer containing functional groups on opposite ends thereof. An additional amount of the aromatic diisocyanate compound may be added at this reaction stage, or the aromatic diisocyanate compound may be present from an initial stage of the reaction.

A total amount of the aromatic diisocyanate compound used may be selected such that the mass ratio of the soft segment to the hard segment in the resultant polycarbodiimide copolymer lies in the above-specified range.

Further, in the present invention, in the carbodiimidation reaction, an aromatic monoisocyanate compound may be added over a whole period of the reaction including an early stage, a middle stage and an late stage to seal the ends of the obtained copolymer. Examples of the aromatic monoisocyanate compound used for the end sealing include phenyl isocyanate, p-nitrophenyl isocyanate, p- or m-tolyl isocyanate, p-formylphenyl isocyanate and p-isopropylphenyl isocyanate. In particular, among these compounds, preferred is p-isopropylphenyl isocyanate. A solution containing the thus end-sealed polycarbodiimide copolymer is excellent in storage stability.

Upon conducting the above carbodiimidation reaction, the total solid content in the reaction system is preferably in the range of 5 to 50% by mass and more preferably 20 to 30% by mass.

The thus obtained thermosetting polycarbodiimide copolymer of the present invention has a number-average molecular weight of usually 5000 or higher, preferably 8000 or higher and more preferably 10000 or higher in terms of polystyrene as measured by gel permeation chromatography (GPC).

The end groups of the thermosetting polycarbodiimide copolymer of the present invention may be sealed with a monofunctional active hydrogen compound such as dibutyl amine or a monocyanate such as phenyl isocyanate.

The thermosetting polycarbodiimide copolymer of the present invention may be heat-cured at a temperature of usually 100 to 300° C. and preferably 120 to 250° C.

When the polycarbodiimide copolymer is used in various applications, the copolymer may be usually blended with various additives to prepare a thermosetting resin composition.

Also, the thermosetting resin composition containing the polycarbodiimide copolymer is involved in the scope of the present invention.

Thus, the thermosetting resin composition of the present invention may contain various additives in addition to the polycarbodiimide copolymer according to requirements. Examples of the additives used in the thermosetting resin composition include inorganic fillers for enhancing an elastic modulus thereof, plasticizers for enhancing a flexibility thereof, smoothening agents for attaining a surface smoothness, leveling agents, and defoamers. These additives may be blended in an appropriate amount in the composition. Further, in the case where the thermosetting resin composition is applied to adhesive films, in order to impart an electric conductivity thereto, improve a thermal conductivity thereof and control an elastic modulus thereof, the composition may contain various inorganic particles made of metals such as aluminum, copper, silver, gold, nickel, chromium, lead, tin, zinc, palladium and solder and alloys thereof, ceramic materials such as alumina, silica, magnesia and silicon nitride, and the other materials such as carbon.

Also, in the present invention, there is provided a heat-resistant flexible film obtained by forming the polycarbodiimide copolymer or the thermosetting resin composition into a film and subjecting the film to a heat curing treatment.

The heat-resistant flexible film of the present invention may be produced by the following method. That is, a varnish containing the polycarbodiimide copolymer or the thermosetting resin composition is formed into a film having an appropriate thickness by conventionally known methods, for example, casting, spin-coating or roll-coating. The resultant film is dried at a temperature of usually 30 to 180° C. and preferably 50 to 160° C. though it varies depending upon the solvent used for the synthesis, and then heat-cured at a temperature of usually 100 to 300° C. and preferably 120 to 250° C.

The thickness of the thus obtained heat-resistant flexible film according to the present invention is not particularly limited, and may be appropriately selected according to applications thereof. The thickness of the heat-resistant flexible film is usually in the range of about 1 to 200 µm and preferably 5 to 100 µm.

The above varnish containing the polycarbodiimide copolymer or the thermosetting resin composition may also be used for production of adhesive films. The adhesive film may be produced by applying the varnish onto an appropriate substrate, or by previously forming the varnish into an uncured film as described above, and then pressing and laminating the uncured film on the substrate.

The resultant adhesive film is then heat-cured to obtain a heat-cured product exhibiting not only a strong adhesion force but also a low elastic modulus. The heat curing treatment may be conducted by an appropriate method using a heater, an ultrasonic wave or an ultraviolet light. Therefore, the adhesive film may be suitably used for adhesion of various materials, in particular, for fixing electric or electronic parts such as typically semiconductor chips or lead frames. The thus obtained adhesive film has advantages such as low elastic modulus, facilitated handing due to a good flexibility, good adhesion to semiconductors, and good storage stability.

Examples of the substrate used together with the adhesive film include metal foils and insulating films. Specific examples of the metal foils include those made of aluminum, copper, silver, gold, nickel, indium, chromium, lead, tin, zinc, palladium, etc. These metal foils may be used singly or in the form of an alloy thereof. Specific examples of the insulating films include films having a heat resistance or a chemical resistance such as polyimide films, polyester films and polyethylene terephthalate films.

EXAMPLES

The present invention is described in more detail by referring to the following examples and comparative examples.

Example 1

A 1 L four-necked flask was charged with 50.0 g of 4,4'-diphenylmethane diisocyanate (hereinafter referred to merely as "MDI"), 74.0 g of PTMG 1000 available from Sanyo Kasei Co., Ltd., and a mixed solvent composed of 320.0 g of toluene and 180.0 g of methyl ethyl ketone (MEK), and then immersed in an oil bath at 90° C., and the contents of the flask were stirred under heating for 3 h. Then, 0.06 g of 3-methyl-1-phenyl-2-phospholene-1-oxide (hereinafter referred to as a "carbodiimidation catalyst") was charged into the flask, and the contents of the flask were heated to 110° C. and then subjected to carbodiimidation reaction for 5 h, thereby obtaining a polycarbodiimide copolymer solution 1.

Example 2

A 1 L four-necked flask was charged with 70.0 g of tolylene diisocyanate (a mixture containing 2,4-tolylene diisocyanate and 2,6-tolylene diisocyanate at a mixing ratio of 80:20) and 50.0 g of PTMG 1400 available from Sanyo Kasei Co., Ltd., and then immersed in an oil bath at 80° C., and the contents of the flask were stirred under heating for 3 h. Next, 500.0 g of tetrahydrofuran (THF) as a solvent was charged into the flask to prepare a uniform solution, and then 0.09 g of the carbodiimidation catalyst was charged into the flask to subject the contents of the flask to carbodiimidation reaction for 12 h, thereby obtaining a polycarbodiimide copolymer solution 2.

Example 3

A 1 L four-necked flask was charged with 30.0 g of MDI, 60.0 g of PEBA (melting point: 132° C.; molecular weight: 7200) and 450.0 g of cyclohexanone as a solvent, and then immersed in an oil bath at 160° C. to react the contents of the flask under reflux while stirring for 2 h. After cooling the resultant reaction solution to 110° C., 0.06 g of the carbodiimidation catalyst was charged into the flask to subject the contents of the flask to carbodiimidation reaction for 4 h, thereby obtaining a polycarbodiimide copolymer solution 3.

Example 4

A 1 L four-necked flask was charged with 140.0 g of MDI, 70.0 g of PCDL 5650 available from Asahi Kasei Co., Ltd., and a mixed solvent composed of 300.0 g of cyclohexanone and 150 g of MEK, and then immersed in an oil bath at 100° C. to react the contents of the flask under heating while stirring for 2 h. After 0.06 g of the carbodiimidation catalyst was charged into the flask, the contents of the flask were heated to 120° C. and then subjected to carbodiimidation reaction for 4 h, thereby obtaining a polycarbodiimide copolymer solution 4.

Meanwhile, PCDL 5650 has a structure represented by the following formula:

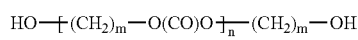

wherein m is 5 and 6; and n is number of 6 to 7.

Example 5

A 1 L four-necked flask was charged with 140.0 g of MDI, 30.0 g of PCDL 4671 available from Asahi Kasei Co., Ltd., 10.0 g of PTMG 1000 available from Mitsubishi Chemical Corp., and a mixed solvent composed of 200.0 g of toluene and 250 g of MEK, and then immersed in an oil bath at 100° C. to react the contents of the flask under heating while stirring for 2 h. After 0.06 g of the carbodiimidation catalyst was charged into the flask, the temperature of the oil bath was raised to 110° C. to subject the contents of the flask to carbodiimidation reaction for 4 h, thereby obtaining a polycarbodiimide copolymer solution 5.

Meanwhile, PCDL 4671 has a structure represented by the following formula:

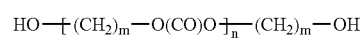

wherein m is 4 and 6; and n is number of 6 to 8.

Comparative Example 1

A 1 L four-necked flask was charged with 150.0 g of MDI, 74.0 g of polyethylene glycol (PEG 1000) and a mixed solvent composed of 300.0 g of toluene and 150 g of MEK, and then immersed in an oil bath at 100° C. to react the contents of the flask under heating while stirring for 2 h. After 0.06 g of the carbodiimidation catalyst was charged into the flask, the contents of the flask were heated to 120° C. and then subjected to carbodiimidation reaction for 4 h, thereby obtaining a polycarbodiimide copolymer solution 6.

Comparative Example 2

A 1 L four-necked flask was charged with 140.0 g of MDI, 70.0 g of hexamethylene carbonate diol and a mixed solvent composed of 300.0 g of cyclohexanone and 150 g of MEK, and then immersed in an oil bath at 100° C. to react the contents of the flask under heating while stirring for 2 h. After 0.06 g of the carbodiimidation catalyst was charged into the flask, the contents of the flask were heated to 120° C. and then subjected to carbodiimidation reaction for 4 h, thereby obtaining a polycarbodiimide copolymer solution 7.

Example 6

The polycarbodiimide copolymer solution 1 obtained in EXAMPLE 1 was concentrated until the concentration of the copolymer therein reached 25% by mass. The thus concentrated solution was cast onto a polyethylene terephthalate (PET) film treated with a release agent using a table coater, and then dried at 120° C. for 6 min, thereby producing a 30 μm-thick film.

Example 7

The polycarbodiimide copolymer solution 2 obtained in EXAMPLE 2 was concentrated until the concentration of the copolymer therein reached 25% by mass. The thus concentrated solution was cast onto a PET film treated with a release agent using a table coater, and then dried at 120° C. for 4 min, thereby producing a 30 μm-thick film.

Example 8

The polycarbodiimide copolymer solution 3 obtained in EXAMPLE 3 was concentrated until the concentration of the copolymer therein reached 25% by mass. The thus concentrated solution was cast onto a PET film treated with a release agent using a table coater, and then dried at 160° C. for 6 min, thereby producing a 30 µm-thick film.

Example 9

The polycarbodiimide copolymer solution 4 obtained in EXAMPLE 4 was concentrated until the concentration of the copolymer therein reached 25% by mass. The thus concentrated solution was cast onto a PET film treated with a release agent using a table coater, and then dried at 160° C. for 5 min, thereby producing a 30 µm-thick film.

Example 10

The polycarbodiimide copolymer solution 5 obtained in EXAMPLE 5 was concentrated until the concentration of the copolymer therein reached 25% by mass. The thus concentrated solution was cast onto a PET film treated with a release agent using a table coater, and then dried at 130° C. for 6 min, thereby producing a 30 µm-thick film.

Comparative Example 3

A solution prepared by adding 100 parts by mass of PTMG 1000 to 150 parts by mass of a carbodiimide resin synthesized from MDI and phenyl isocyanate which was end-sealed such that a polymerization degree thereof was 100, was concentrated until the concentration thereof reached 25% by mass. The thus concentrated solution was cast onto a PET film treated with a release agent using a table coater, and then dried, thereby producing a 30 µm-thick film.

Comparative Example 4

Fifty grams of CTBN (carboxyl-terminated butadiene-nitrile rubber) and 100 g of MDI were reacted with each other at 180° C. for 5 h, and then 300 g of THF and 0.25 g of the carbodiimidation catalyst were added to the obtained reaction product to further conduct a carbodiimidation reaction thereof, thereby obtaining 100 g of resin particles. The thus obtained resin particles were heat-pressed at 180° C. to produce a 30 µm-thick film.

Comparative Example 5

One hundred parts by mass of a bisphenol A-type epoxy resin was mixed with 6 parts by mass of dicyandiamide, and further 150 parts by mass of fine particles of PEBA used in EXAMPLE 3 were added to the resultant mixture. The resultant composition was uniformly kneaded together using a roll mill, defoamed, and then applied onto a PET film treated with a release agent. Then, the obtained coated film was heated and dried at 150° C. for 5 min, thereby producing a 30 µm-thick film.

Comparative Example 6

The polycarbodiimide copolymer solution 6 obtained in COMPARATIVE EXAMPLE 1 was concentrated until the concentration of the copolymer therein reached 25% by mass. The thus concentrated solution was cast onto a PET film treated with a release agent using a table coater, and then dried at 140° C. for 5 min, thereby producing a 30 µm-thick film.

Comparative Example 7

The polycarbodiimide copolymer solution 7 obtained in COMPARATIVE EXAMPLE 2 was concentrated until the concentration of the copolymer therein reached 25% by mass. The thus concentrated solution was cast onto a PET film treated with a release agent using a table coater, and then dried at 160° C. for 5 min, thereby producing a 30 µm-thick film.

The respective films obtained in EXAMPLES 6 to 10 and COMPARATIVE EXAMPLES 3 to 7 were heat-cured at 175° C. for 90 min to prepare test specimens. These test specimens were tested to evaluate properties thereof according to the following procedures. The results are shown in Table 1. Meanwhile, the film obtained in COMPARATIVE EXAMPLE 4 was directly used in the respective tests.

(1) Resistance to 180° Bending

The film was cut into a tape of 20 mm in width. The obtained tape was bent 180° along the direction perpendicular to the width direction thereof, and a 300 g roller was rolled along a crease of the tape. Then, the crease of the tape was opened to return the tape to its original flat position. This bending/rolling operation as one cycle was repeated three times against the same position to visually observe whether or not any cracks or tear occurred at the crease.

In Table 1, the films which were free from cracks or tear even when subjected to three or more cycles of the operation, were rated as A, whereas the films which suffered from cracks or tear within less than three cycles of the operation were indicated by the number of cycles of the operation at which the cracks or tear occurred.

(2) Glass Transition Point

Using DMA "TMA/SS 6000" available from SII Corp., the measurement was conducted at a temperature rise rate of 5° C./min and an oscillation frequency of 0.1 Hz. The peak value at tan δ in the obtained spectrum was determined as a glass transition point of the respective test specimens. The results were classified into the following ratings according to the glass transition points.

A: 130° C. or higher; and
B: Lower than 130° C.

(3) Heat-Decomposition Temperature

Using "TG/DTA 6020" available from SII Corp., the measurement was conducted at a temperature rise rate of 10° C./min. The temperature at which 5% loss in mass was observed was determined as the heat-decomposition temperature of the respective test specimens.

The results were classified into the following ratings according to the heat-decomposition temperatures.

A: 250° C. or higher; and
B: Lower than 250° C.

TABLE 1

|  | Resistance to 180° bending | Glass transition point (° C.) | Heat-decomposition temperature (° C.) |
|---|---|---|---|
| Example 6 | A | A: 220 | A: 265 |
| Example 7 | A | A: 230 | A: 270 |
| Example 8 | A | A: 208 | A: 310 |
| Example 9 | A | A: 230 | A: 305 |
| Example 10 | A | A: 211 | A: 272 |

TABLE 1-continued

|  | Resistance to 180° bending | Glass transition point (° C.) | Heat-decomposition temperature (° C.) |
|---|---|---|---|
| Comparative Example 3 | 1 | A: 250 | B: 230 |
| Comparative Example 4 | 2 | A: 210 | B: 235 |
| Comparative Example 5 | 1 | B: 130 | B: 240 |
| Comparative Example 6 | A | A: 205 | B: 235 |
| Comparative Example 7 | 1 | A: 228 | A: 275 |

As apparently recognized from Table 1, all of the films produced according to the present invention (EXAMPLES 6 to 10) exhibited not only an excellent resistance to 180° bending but also a high heat resistance.

INDUSTRIAL APPLICABILITY

The thermosetting polycarbodiimide copolymer of the present invention can exhibit not only a high heat resistance and a good flexibility, but also an excellent flexing resistance (resistance to 180° bending), and can be, therefore, suitably used in applications of various electronic parts, for example, as materials of base films or cover-lay films for flexible wiring boards, or adhesive films.

What is claimed is:

1. A thermosettable polycarbodiimide copolymer comprising in a molecule thereof, a soft segment containing at least one residue formed by removing opposite functional end groups of polytetramethylene ether glycol, polyether block amide and polyalkylene carbonate diol having at least two alkylene chains selected from the group consisting of hexamethylene, pentamethylene and tetramethylene; and a hard segment made of polycarbodiimide bonded to the soft segment through at least one bond selected from the group consisting of a urethane bond, a urea bond and an amide bond, wherein said polycarbodiimide copolymer is capable of being thermoset.

2. The thermosettable polycarbodiimide copolymer according to claim 1, wherein a mass ratio of the soft segment to the hard segment is in the range of 20:100 to 500:100.

3. The thermosettable polycarbodiimide copolymer according to claim 1, wherein said copolymer contains constituting units each represented by the general formula (I):

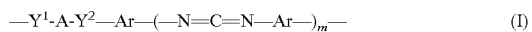

wherein Ar represents an arylene group; A represents a soft segment containing at least one residue formed by removing opposite functional end groups of polytetramethylene ether glycol, polyether block amide and polyalkylene carbonate diol having at least two alkylene chains selected from the group consisting of hexamethylene, pentamethylene and tetramethylene; $Y^1$ and $Y^2$ respectively represent at least one bond having a nitrogen atom bonded to Ar which is selected from the group consisting of a urethane bond, a urea bond and an amide bond; and m is an integer of 1 or more.

4. The thermosettable polycarbodiimide copolymer according to claim 3, wherein a mass ratio of the whole components A to the whole components corresponding to [Ar—(N=C=N—Ar)$_m$] in a molecule of the copolymer is in the range of 0.2 to 5.

5. The thermosettable polycarbodiimide copolymer according to claim 1, wherein a heat-cured product of the copolymer has a glass transition point of 130° C. or higher.

6. A thermosettable polycarbodiimide copolymer containing constituting units each represented by the general formula (I):

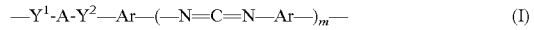

wherein Ar represents an arylene group; A represents a soft segment containing at least one residue formed by removing opposite functional end groups of polytetramethylene ether glycol, polyether block amide and polyalkylene carbonate diol having at least two alkylene chains selected from the group consisting of hexamethylene, pentamethylene and tetramethylene; $Y^1$ and $Y^2$ respectively represent at least one bond having a nitrogen atom bonded to Ar, which is selected from the group consisting of a urethane bond, a urea bond and an amide bond; and m is an integer of 1 or more, said thermosettable polycarbodiimide copolymer being produced by reacting a polymer exhibiting a liquid state or a flexible solid state at an ordinary temperature which is represented by the general formula (II):

wherein $X^1$ and $X^2$ respectively represent a functional group selected from the group consisting of a hydroxyl group, an amino group and a carboxyl group; and A is at least one residue formed by removing opposite functional end groups of polytetramethylene ether glycol, polyether block amide and polyalkylene carbonate diol having at least two alkylene chains selected from the group consisting of hexamethylene, pentamethylene and tetramethylene, with an aromatic diisocyanate compound represented by the general formula (III):

wherein Ar is the same as defined above, to obtain a both end isocyanate-terminated compound having isocyanate groups on opposite ends thereof which is represented by the general formula (IV):

wherein $Y^1$, $Y^2$, Ar and A are the same as defined above; and p is an integer of 1 or more; and subjecting the obtained both end isocyanate-terminated compound to a carbodiimidation reaction in the presence of a carbodiimidation catalyst, wherein said polycarbodiimide copolymer is capable of being thermoset.

7. A process for producing a thermosettable polycarbodiimide copolymer containing constituting units each represented by the general formula (I):

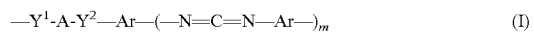

wherein Ar represents an arylene group; A represents a soft segment containing at least one residue formed by removing opposite functional end groups of polytetramethylene ether glycol, polyether block amide and polyalkylene carbonate diol having at least two alkylene chains selected from the group consisting of hexamethylene, pentamethylene and tetramethylene; $Y^1$ and $Y^2$ respectively represent at least one bond having a nitrogen atom bonded to Ar, which is selected from the group consisting of a urethane bond, a urea bond and an amide bond; and m is an integer of 1 or more, said process comprising:

reacting a polymer exhibiting a liquid state or a flexible solid state at an ordinary temperature which is represented by the general formula (II):

wherein $X^1$ and $X^1$ respectively represent a functional group selected from the group consisting of a hydroxyl group, an amino group and a carboxyl group; and A is at least one residue formed by removing opposite functional end groups of polytetramethylene ether glycol, polyether block amide and polyalkylene carbonate diol having at least two alkylene chains selected from the group consisting of hexamethylene, pentamethylene and tetramethylene, with an aromatic diisocyanate compound represented by the general formula (III):

OCN—Ar—NCO     (III)

wherein Ar is the same as defined above, to obtain a both end isocyanate-terminated compound having isocyanate groups on opposite ends thereof which is represented by the general formula (IV):

OCN—Ar—(Y$^1$-A-Y$^2$—Ar)$_p$—NCO     (IV)

wherein $Y^1$, $Y^2$, Ar and A are the same as defined above; and p is an integer of 1 or more; and subjecting the obtained both end isocyanate-terminated compound to a carbodiimidation reaction in the presence of a carbodiimidation catalyst, wherein said polycarbodiimide copolymer is capable of being thermoset.

8. The process according to claim 7, wherein said polymer exhibiting a liquid state or a flexible solid state at an ordinary temperature which is represented by the general formula (II) is at least one compound selected from the group consisting of polytetramethylene ether glycol, polyether block amide and polyalkylene carbonate diol having at least two alkylene chains selected from the group consisting of hexamethylene, pentamethylene and tetramethylene.

9. A thermosettable resin composition comprising the thermosettable polycarbodiimide copolymer as claimed in claim 1.

10. A heat-resistant flexible film produced by forming the thermosettable polycarbodiimide copolymer as claimed in claim 1 into a film, and subjecting the film to a heat curing treatment.

11. The thermosettable polycarbodiimide copolymer according to claim 2, wherein said copolymer contains constituting units each represented by the general formula (I):

—Y$^1$-A-Y$^2$—Ar—(—N=C=N—Ar—)$_m$—     (I)

wherein Ar represents an arylene group; A represents a soft segment containing at least one residue formed by removing opposite functional end groups of polytetramethylene ether glycol, polyether block amide and polyalkylene carbonate diol having at least two alkylene chains selected from the group consisting of hexamethylene, pentamethylene and tetramethylene; $Y^1$ and $Y^2$ respectively represent at least one bond having a nitrogen atom bonded to Ar which is selected from the group consisting of a urethane bond, a urea bond and an amide bond; and m is an integer of 1 or more.

12. The thermosettable polycarbodiimide copolymer according to claim 3, wherein a heat-cured product of the copolymer has a glass transition point of 130° C. or higher.

13. A thermosettable resin composition comprising the thermosettable polycarbodiimide copolymer as claimed in claim 6.

14. A heat-resistant flexible film produced by forming the thermosettable polycarbodiimide copolymer as claimed in claim 6 into a film, and subjecting the film to a heat curing treatment.

15. A heat-resistant flexible film produced by forming the thermosettable resin composition as claimed in claim 9 into a film, and subjecting the film to a heat curing treatment.

16. The heat-resistant flexible film as claimed in claim 10, wherein the thermosettable polycarbodiimide copolymer has been thermoset in said heat curing treatment.

17. The heat-resistant flexible film as claimed in claim 14, wherein the thermosettable polycarbodiimide copolymer has been thermoset in said heat curing treatment.

18. The heat-resistant flexible film as claimed in claim 15, wherein the thermosettable resin composition has been thermoset in said heat curing treatment.

* * * * *